United States Patent

Burrell

[15] 3,696,422

[45] Oct. 3, 1972

[54] NAVIGATION RECEIVER/COMMUNICATIONS TRANSCEIVER AND FREQUENCY SYNTHESIZER ASSOCIATED THEREWITH

[72] Inventor: Gary L. Burrell, Overland Park, Kans.

[73] Assignee: King Radio Corporation, Olathe, Kans.

[22] Filed: Feb. 27, 1970

[21] Appl. No.: 15,061

[52] U.S. Cl. ..............343/100, 325/17 R, 343/175 R

[51] Int. Cl. ..............................................H04b 7/00

[58] Field of Search ........343/175, 179, 100; 325/58, 325/17, 25

[56] References Cited

UNITED STATES PATENTS

| | | | |
|---|---|---|---|
| 2,964,714 | 12/1960 | Jakubowics | 325/17 X |
| 3,327,216 | 6/1967 | Sichak | 343/175 X |
| 3,085,202 | 4/1963 | Jakubowics | 325/25 |
| 3,487,311 | 12/1969 | Luhowy | 325/25 X |

*Primary Examiner*—Carl D. Quarforth
*Attorney*—Scofield, Kokjer, Scofield & Lowe

[57] ABSTRACT

The subject NAV/COM unit incorporates a multi-channel navigation receiver with a multi-channel communications transceiver and associated audio system. The NAV/COM unit utilizes analog, digital and heterodyne techniques in a unique combination to accomplish frequency synthesis in simplex transceivers. A stabilized master oscillator (SMO) provides frequency generation. A feedback loop is used to slave a voltage controlled oscillator (VCO) frequency to an exact multiple of a crystal controlled reference oscillator frequency. The VCO output frequency is divided by two, mixed with a signal from a high frequency crystal oscillator, divided by *n*, and compared in frequency and phase with a low frequency crystal oscillator signal. The filtered error signal provides bias to the VCO in such a manner that when the VCO frequency is low, the error signal is a high voltage, and when the VCO frequency is above the desired frequency, the error signal is a low voltage. This error signal drives the VCO towards the selected frequency. When the VCO gets within a certain range of the desired frequency, the loop captures the VCO and pulls it into phase lock. In this condition, the loop establishes an error signal that is essentially a square wave with a frequency equal to that of the reference oscillator. A low pass filter recovers the DC component of the square wave and biases the VCO to maintain the selected frequency output. The square wave duty factor and thus the filtered DC/VCO bias voltage, varies accordingly with selected VCO frequency.

The communications section utilizes a two crystal heterodyne oscillator in its associated SMO for two band frequency synthesis.

8 Claims, 8 Drawing Figures

INVENTOR
Gary L. Burrell
BY
Scofield, Kokjer, Scofield & Lowe
ATTORNEYS

INVENTOR.
Gary L. Burrell
BY
Scofield, Kokjer, Scofield & Lowe
ATTORNEYS

INVENTOR
Gary L. Burrell
BY
Scofield, Kokjer, Scofield & Lowe
ATTORNEYS

| | HIGH BAND | LOW BAND |
|---|---|---|
| HI XTAL | T | R |
| LO XTAL | R | T |

| | NAV. | | | COM. | | | |
|---|---|---|---|---|---|---|---|
| MODE OF ODERATION | XMIT LOW BAND | XMIT HIGH BAND | REC | XMIT LOW BAND | XMIT HIGH BAND | REL. LOW BAND | REC HIGH BAND |
| SELECTED XTAL | LOW | HIGH | LOW | LOW | HIGH | HIGH | LOW |

INVENTOR.
Gary L. Burrell
BY
Scofield, Kokjer, Scofield + Lowe
ATTORNEYS

NAVIGATION RECEIVER/COMMUNICATIONS TRANSCEIVER AND FREQUENCY SYNTHESIZER ASSOCIATED THEREWITH

BACKGROUND AND BRIEF DESCRIPTION OF THE INVENTION

Reference may be made to the King Radio Corporation, of Olathe, Kansas, *Maintenance Manual, KX–170 Navigation Receiver Communications Transceiver*, for an extremely detailed discussion of the circuits and theory of operation of the above-mentioned invention.

A super heterodyne receiver which permits the frequency adjustment of its associated local oscillator in precisely controlled frequency increments generally designates the local oscillator system as a frequency synthesizer. Also, when a transmitter is employed in conjunction with a receiver in simplex operation, the frequency of the local oscillator ($f_{LO}$) is equal to the transmitter frequency ($f_{xmit}$) plus or minus the frequency of the IF strip ($f_{IF}$). This, of course, means that whenever the system changes from transmit to receive, or vice versa, the synthesize frequency must change by increments equal to the IF frequency.

Prior art frequency synthesizers have been constructed by heterodyning a number of crystal controlled frequencies together. Generally, these crystal controlled frequencies are associated with crystal banks providing multiple selection in each bank so that if three crystal banks are utilized ($f_1$, $f_2$, and $f_3$) then the output frequency ($f\,\text{out}=f_1 \pm f_2 \pm f_3$).

Two other methods are commonly used to make the receiver transmit frequency jumps when heterodyne frequency synthesizers are used in simplex transceivers. One method is to heterodyne the synthesizer output frequency with the frequency obtained from a crystal controlled oscillator operating at the IF frequency. The oscillator is switched on for transmit and off for receive. This method requires an additional crystal, oscillator, and filter network.

Other systems have used a concept that requires the shifting of one of the internal heterodyne oscillators by an amount corresponding to the desired receive to transmit frequency change. This is accomplished by adding one or more crystals to the associated crystal bank, and by stepping from one to another according to the frequency selected or to the transmit/receive mode.

My invention relates to the utilization of a stabilized master oscillator (SMO) as a frequency synthesizer in a NAV/COM unit. By a unique combination of SMO components, I have alleviated the problems normally associated with loop instability, decreased cost, increased reliability, and simplified maintenance and accessibility to the portions of the system normally in need of repair or adjustment. My frequency synthesizer in conjunction with the NAV/COM unit described briefly above utilizes heterodyne techniques in conjunction with a SMO system (utilizing both analog and digital concepts therein) to accomplish frequency synthesis in simplex transceivers.

As suggested above, the SMO system utilizes a VCO output frequency which is divided by a fixed integer $K$, and mixed with a heterodyne oscillator frequency, $f_{hf}$. A programmable divider divides the mixer output frequency by a selected ratio, $n$. A phase and frequency comparator compares the frequency from the programmable divider ($f_x$) and the reference frequency ($f_{ref}$ which is common to both the navigation SMO and the communication SMO) and provides an error signal which, when filtered, forces the condition $f_x = f_{ref}$. This forced condition, referred to as phase lock, establishes the output frequency ($f_{out} = K\,(f_{hf} - nf_{ref})$). The synthesized frequency may be varied in increments by changing the divide ratio $n$. The operation described above relates to both the communications SMO portion of the NAV/COM unit, and to the NAV SMO in that both are similar in operation except that the COM SMO has to provide the transmit/receive frequency shift required in simplex transceivers.

An object of my invention is to provide a uniquely constructed method and apparatus for performing frequency synthesis in combination with heterodyne techniques in navigation and communication equipment.

A further object of my invention is to provide a uniquely constructed system for performing frequency synthesis utilizing only two heterodyne oscillator crystals in the communication portion of a NAV/COM unit and a single heterodyne oscillator crystal in a navigation portion of the unit. It is, therefore, a feature of my invention that the associated digital circuitry and cost of manufacture may be minimized.

A still further object of my invention is to provide a uniquely constructed frequency synthesizer that obviates the heretofore requirement of dividing the highest communication frequency down to a reference frequency thereby requiring a division integer of several thousand in quantity. Accordingly, stability of operation is increased.

A still further object of my invention is to provide a uniquely constructed method and apparatus for frequency synthesis in navigation/communication equipment wherein frequency stability is to be determined primarily by the high frequency heterodyne oscillator crystal as opposed to a determination based on the low frequency reference frequency crystal.

Another object of my invention is to provide a uniquely constructed frequency synthesizer system that operates to enhance frequency stability. It is a feature of this object that requirements for crystal tolerance, temperature stabilization and/or excessive amounts of frequency division of the low reference frequency oscillator is minimized.

A further object of my invention is to provide a convenient means for rapid, simple, transmit to receive and receive to transmit frequency transition in frequency synthesizers comprising a portion of navigation/communication equipment.

A further object of my invention is to provide a uniquely constructed frequency synthesizer for utilization in navigation/communication units wherein high side receiver mixer injections is used when any channel is selected in the low band, and wherein low side injection is employed when high band channels are selected. An important feature of this object is that local oscillator radiation within the communications band does not, therefore, interfere with the navigation signals.

A still further object of my invention is to provide a unique frequency synthesizer utilized in navigation/communication equipment of the character described above wherein the synthesis of 360 channels is accomplished with a 180 digit programmable counter.

A further object of my invention is to provide a uniquely constructed frequency synthesizer for navigation/communication equipment wherein spurious radiation is substantially reduced over known prior art units. It is a feature of my invention that a programmable counter is utilized in a synthesis of 360 channels and that said counter performs same with only 180 digits. In this manner, the maximum operating frequency of the counter is cut in half and is required to cover only half the range, therefore reducing associated spurious radiation.

Another object of my invention is to provide a uniquely constructed frequency synthesizer for navigation/communication equipment which allows for a very rapid transition between transmit and receive and minimizes the transient effects of same.

Another object of my invention is to provide a uniquely constructed frequency synthesizer for navigation/communication equipment which minimizes the interference possibilities with other navigation equipment.

Another object of my invention is to provide a unique frequency synthesizer for navigation/communication which requires fewer digit channels per band and decreases the variation in loop gain which in turn simplifies loop stabilization.

An important object of my invention is to provide a uniquely constructed NAV/COM unit utilizing a stabilized master oscillator system which includes substantially the same components therein for both the navigation SMO and the communication SMO thereby reducing cost by consolidating parts, and increasing quantities. Furthermore, the simplification of maintenance in trouble shooting by substitution and comparison techniques are enhanced and made easier.

Another object of my invention is to provide a uniquely constructed frequency synthesizing method and apparatus that utilizes a single crystal oscillator for a reference frequency with two or more stabilized master oscillators. It is a significant feature of this object that the cost of crystal oscillators are substantially reduced in sophisticated equipment, where it becomes necessary to use ultrastable, ultraprecise crystals and temperature stabilization devices. The selection and utilization of a single stable and precise crystal optimalizes the benefits derived from the crystal technique.

Another object of my invention is to provide a unique method and apparatus in NAV/COM equipment for operation of the COM or NAV function in either mode, but not simultaneously, with a single SMO. Also when two SMOs are used, the method and apparatus provides simultaneous NAV/COM functions.

A still further object of my invention is to provide a unique frequency synthesizing technique which utilizes a plurality of VCOs controlled by a single feedback loop as part of a stabilized master oscillator. This amounts to a cost reduction and simplification in that need for additional SMO's has been obviated.

Other and further objects of the invention, together with the features of novelty appurtenant thereto, will appear in the course of the following description.

DETAILED DESCRIPTION OF THE INVENTION

Figure 1:
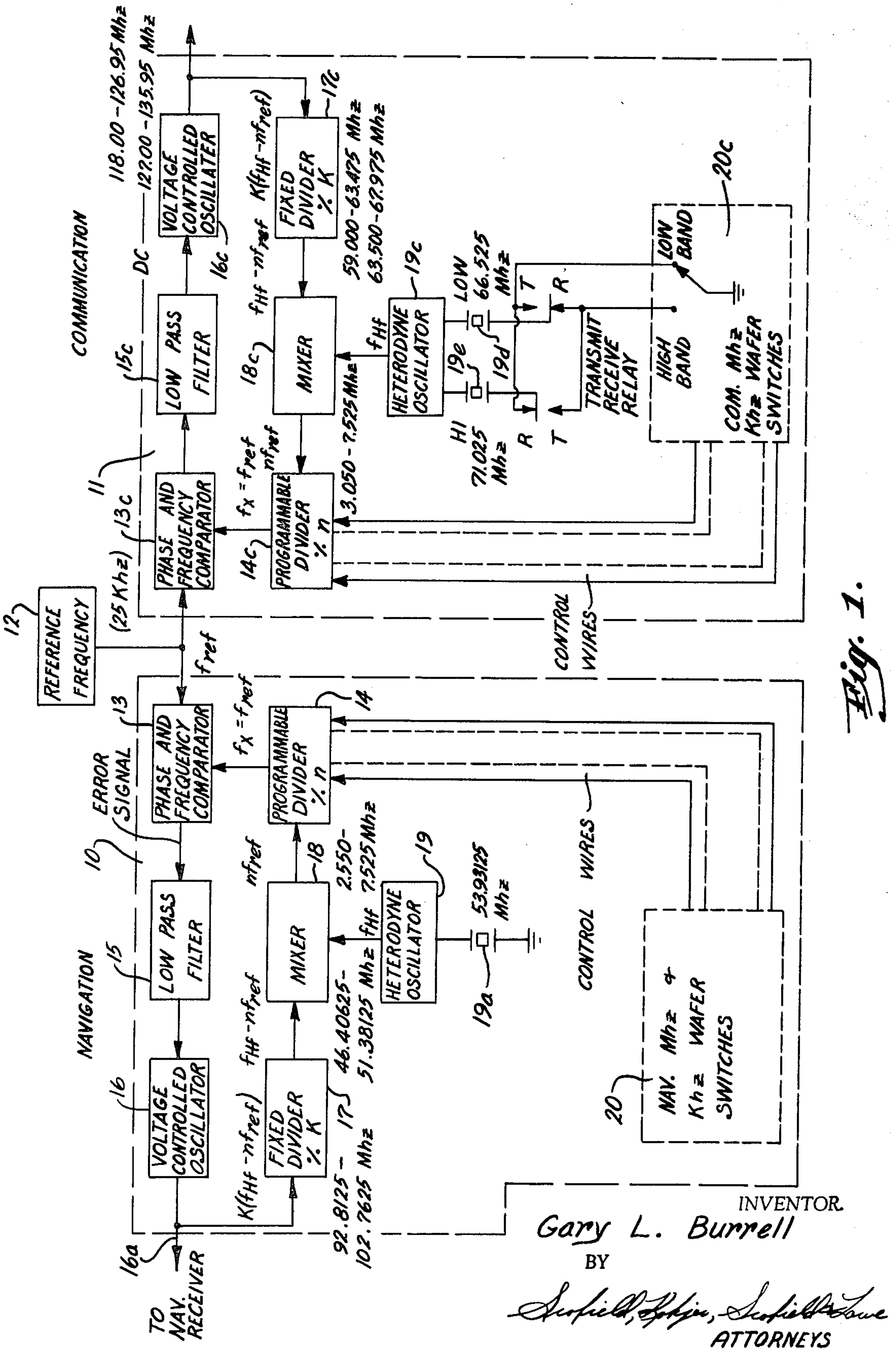
Figures 1A, 3:
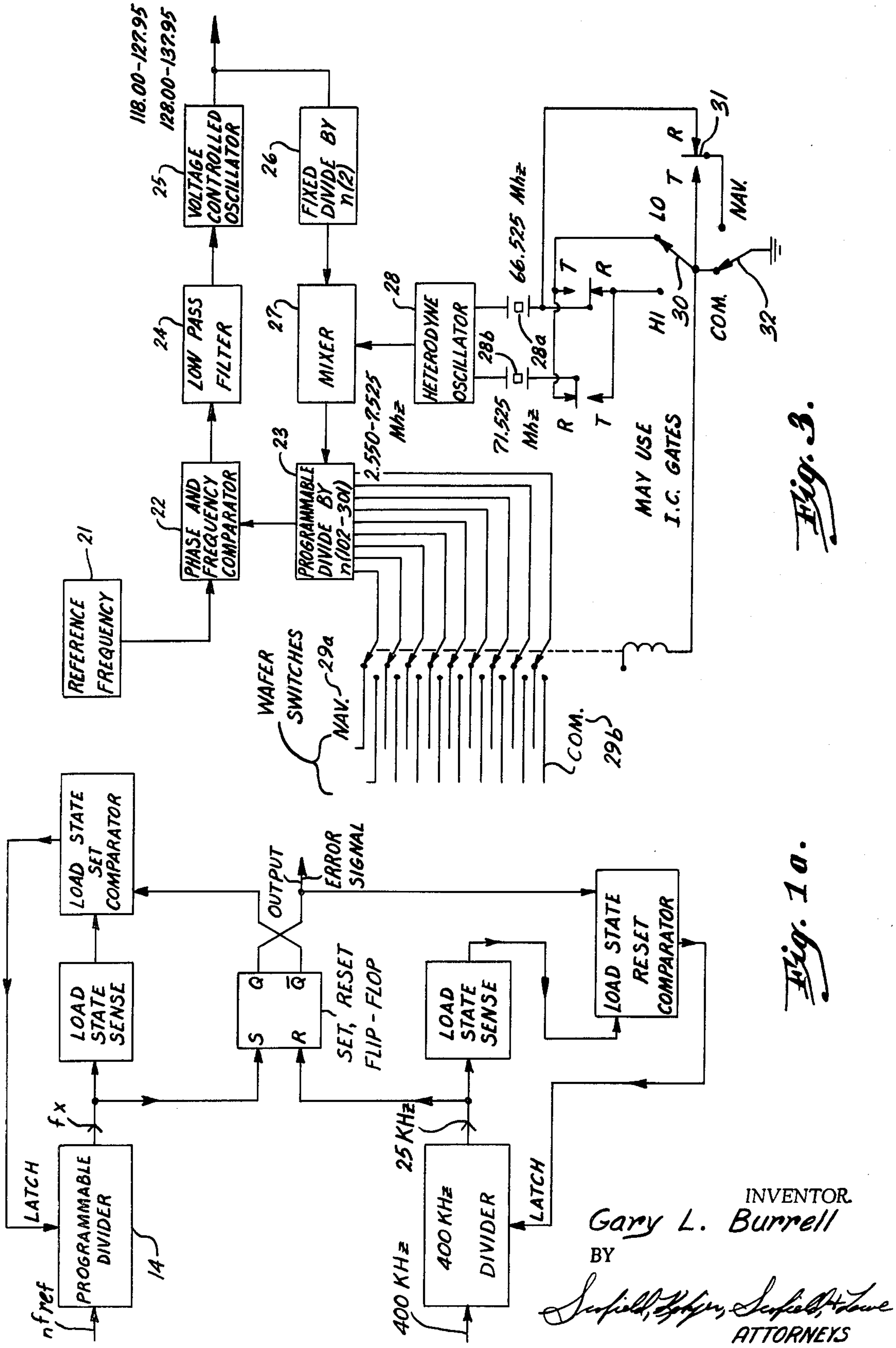
Figure 4:
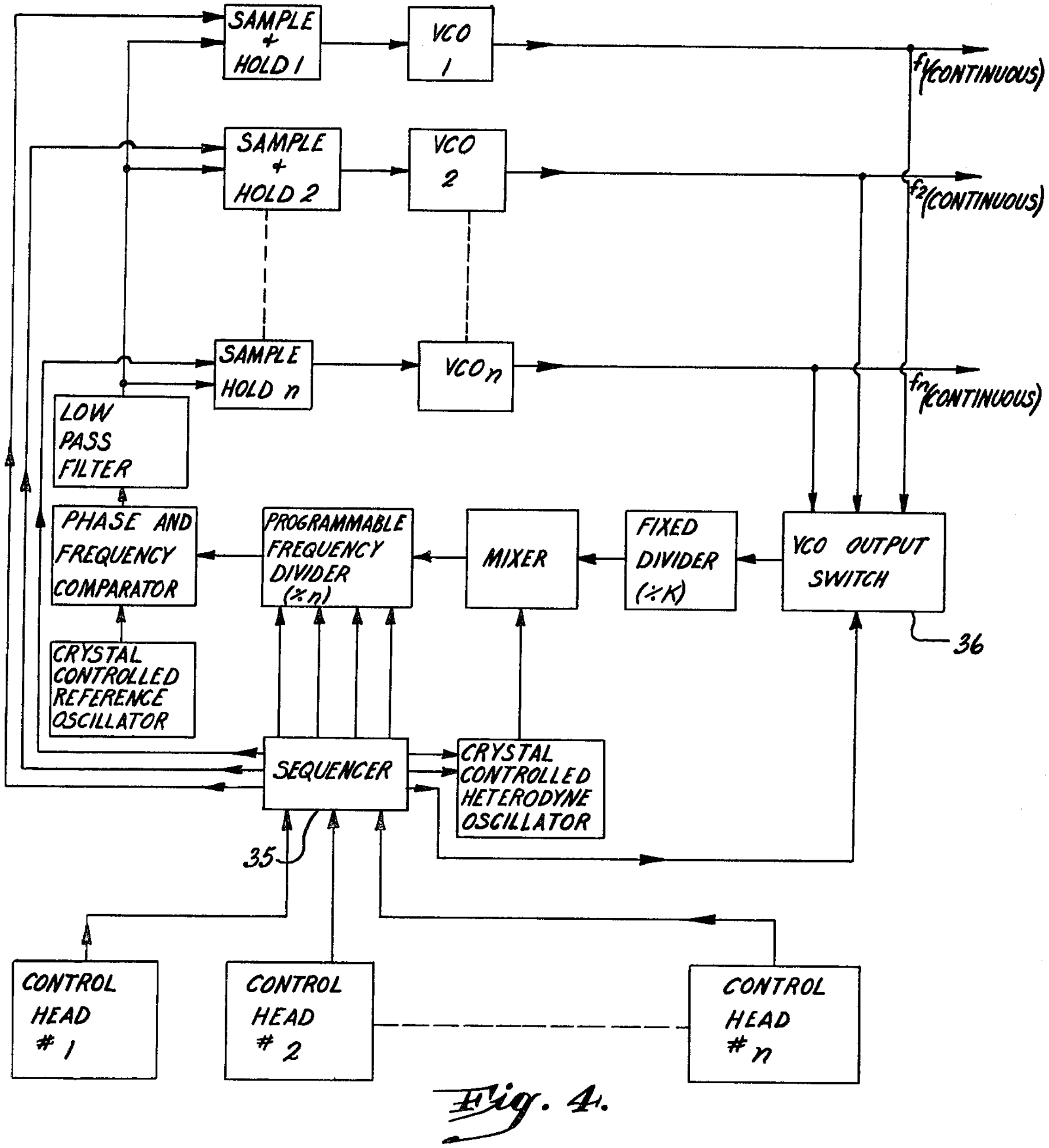
Figures 2, 2A:
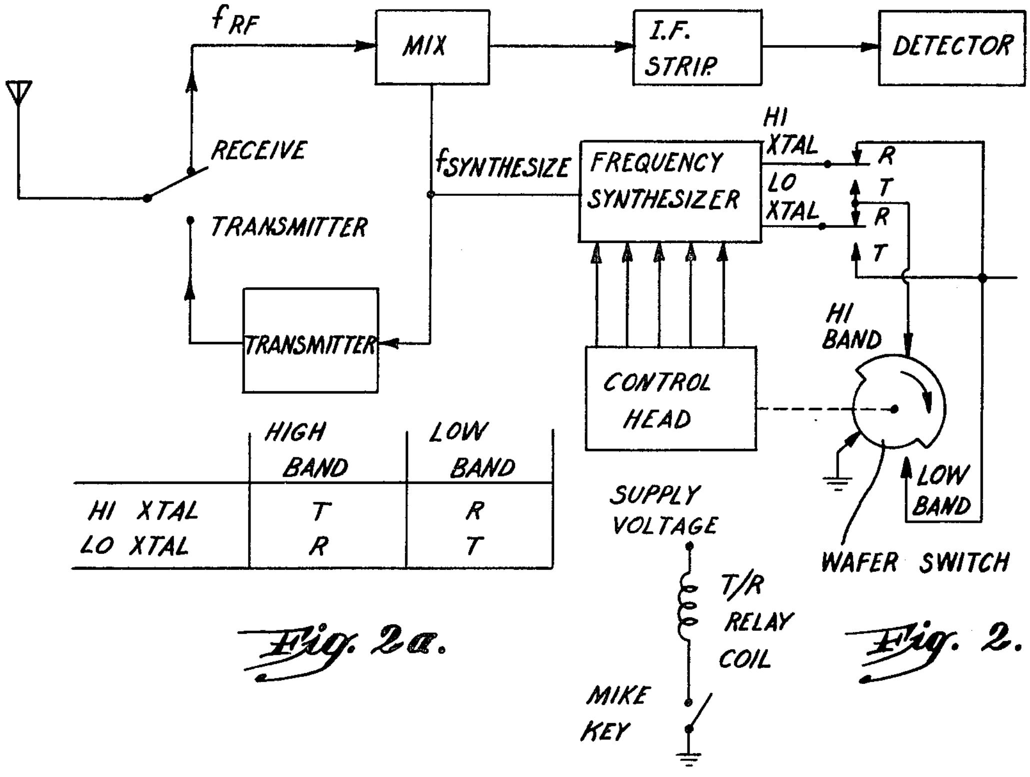

In the accompanying drawings, which form a part of the specification and are to be read in conjunction therewith and in which like reference numerals are employed to indicate like parts in the various views:

FIG. 1 is a block diagram of the combined navigation and communication frequency synthesizer system utilizing a single reference frequency;

FIG. *1a* is a block diagram of the phase and frequency comparator used in both the NAV SMO and the COM SMO;

FIG. *1b* is a plot of error signal v. $f_{ref}$ which shows the phase and frequency transfer function;

FIG. 2 is a block diagram showing the basic transmit and receive elements utilized in the transceiver portion of the NAV/COM unit;

FIG. *2a* is a table showing the allocation of crystals per band in both transmit and receive;

FIG. 3 is a block diagram showing the frequency synthesizing techniques employed in a "1" SMO system utilizable in the COM section;

FIG. *3a* is a block diagram showing overall modes of operation in both the navigation and communication with a selected crystal; and FIG. 4 is a block diagram showing the utilization of multiplex techniques in a "1 + 1" system with several VCOs controlled by one feedback loop.

Turning now more particularly to FIG. 1, my navigation/communication unit is shown in block diagram form therein and includes a navigation SMO (stabilized master oscillator) 10 and a communication SMO 11. Both SMO's utilize a common reference frequency emanating from a reference frequency crystal control oscillator 12 which provides a 25 KHZ reference signal ($f_{ref}$) to same. Alternately, a reference signal having a larger frequency may be used with circuit provisions for further dividing the same down to a preselected value.

The SMO's utilized in both the navigation and the communication portions of the circuit are substantially similar due to the unique combination of components which will be discussed in more detail later, however, the discussion of unique features of same may be initially directed to the navigation SMO 10 with the understanding that many operational features will also apply to the communication SMO.

Figure 1B:
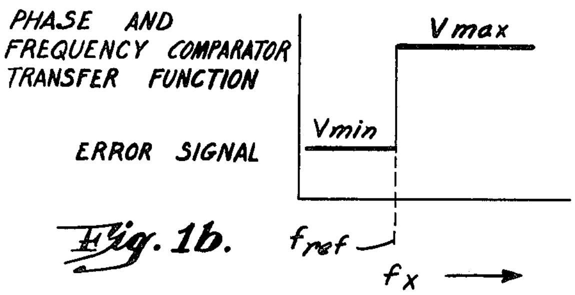

The 25 KHz signal is transmitted to a phase and frequency comparator 13. Comparator 13 provides phase detection and frequency discriminator action in that it compares the frequency from a programmable divider 14 identified in FIG. 1 as $f_x$ with the reference frequency $f_{ref}$ (see FIG. 1b for a plot of the transfer function of same). Frequency discriminator action is initiated when $f_x$ does not equal $f_{ref}$. In the frequency discriminator mode, the error signal (the output signal from phase and frequency comparator 13) is a dominant high DC voltage or dominant low DC voltage depending upon the relationship of the two frequencies. In this mode, if $f_x$ is greater than $f_{ref}$, the error signal assumes the maximum DC potential ($V_{max}$). Conversely, if $f_x$ is below $f_{ref}$, the output voltage is low ($V_{min}$).

The phase and frequency comparator makes a transition from frequency discrimination to phase detection as $f_x$ approaches $f_{ref}$. In this mode, an error signal is generated that jumps between $V_{max}$ and $V_{min}$ at the reference frequency rate. The feedback loop adjusts the duty cycle to develop the appropriate DC component to force the condition where $f_x$ equals $f_{ref}$ ("force" implies a feedback loop operation).

The phase and frequency comparator is shown in more detail in FIG. 1*a*. As was suggested above, the reference frequency from reference frequency oscillator 12 may be initially larger than the KHZ KHz signal originally indicated. I have found it convenient to utilize a 400 KHZ low reference oscillator square wave and to divide same in the 400 KHZ divider. As a result, the 25 KHZ signal is appearing on the output of that divider.

The Set, Reset flip-flop is a principal element of the phase and frequency comparator 13. There are essentially three modes of operation for comparator 13. In the phase detector mode, the inputs to Set, Reset flip-flop at both the set port (S) and the reset port (R) are 25 KHZ square waves ($f_x = f_{ref}$). When $f_x$ makes a positive transition, Q goes to a "1" state and conversely when $f_{ref}$ makes a positive transition, Q goes to the "0" state. The signal on the terminal labeled out-put is a 25 KHZ square wave with a duty cycle proportional to the phase difference of the two input pulse trains.

In the frequency discriminator mode, $f_x \# f_{ref}$. Under the condition of $f_x$ being greater than $f_{ref}$, a pulse arriving at the set port (S) sets the Q (R), high making the $\bar{Q}$ output low. With the $\bar{Q}$ output low, the load state set comparator is activated. When the programmable divider 14 reaches its load state (one state away from a set pulse), it initiates the load state set comparator which in turn latches the programmable divider. The programmable divider remains latched and waits for a 400 KHZ divider pulse (the 25 KHZ signal $f_{ref}$) is received at reset port (R). When this pulse is received, it disables the load state set comparator of the programmable divider and unlatches the programmable divider. The programmable divider immediately responds with a pulse at set port (S) and the programmable divider continues to count until it again reaches the load state, latches, and waits for the 400 KHZ divider output pulse (25 KHZ). The comparator output would be predominantly a high DC voltage ($V_{max}$) with a very short duty cycle low DC voltage ($v_{min}$).

The opposite condition is when the 400 KHZ divider frequency output (25 KHZ) $f_{ref}$ is greater than $f_x$. In this condition, when a pulse is received at the reset port (D), Q goes low which activates the load state reset comparator. When the load state is reached on the 400 KHZ divider, the load state sense circuit activates the load state reset comparator which latches the 400 KHZ reference divider. This causes the 400 KHZ divider to wait until a pulse is received at the set (S) port from the programmable divider. That pulse causes the Set, Reset flip-flop output to go high. However, immediately the 400 KHZ divider responds with a pulse at the reset port (R) causing the output to go low again. The operation continues as described so that the output voltage would be a predominantly low voltage ($V_{min}$) with a very short period where the Set, Reset flip-flop output would be in the high state ($V_{max}$).

From the above, it is clear that in phase detection, the output would be a 25 KHZ square wave having a duty cycle with a DC component which when filtered with low pass filter 15, it is adequate to provide proper bias for VCO 16.

In the condition where the programmable divider output frequency $f_x$ is below the $f_{ref}$ frequency, the output would be a dominant low voltage which, when filtered, would sweep the VCO toward the desired frequency. Finally, the third condition is when the programmable divider frequency $f_x$ is greater than the 25 KHZ reference frequency which results in the output remaining predominantly high and when filtered, would again sweep the VCO toward the desired frequency.

The error signal developed by the phase and frequency comparator is applied to low pass filter 15. This filter recovers the DC component from the error signal and in turn applies it to VCO 16. The VCO (voltage controlled oscillator) converts the voltage (bias voltage applied to the VCO) to a VHF frequency, same being approximately proportionate to the DC voltage.

The VCO output signal serves two functions:

1. It applies local oscillator injection for the navigation receiver (not shown but indicated as being in the directional arrow **16*a***); and
2. It supplies a feedback signal for the SMO system.

The VCO signal applied to the local oscillator of the NAV receiver provides channeling information and assists in the signal processing of the navigation signal. It should be pointed out, however that this signal is controlled by the feedback loop which will be discussed in more detail.

The feedback loop consists of the fixed frequency divider 17, the mixer 18, the heterodyne oscillator 19, the programmable divider 14, and the NAV MHZ and KHZ wafer switches 20. The fixed divider operates to divide the VCO output frequency by an integer *K* (a constant). In actual practice, regenerative dividers or flip-flops may be used to accomplish this division which reduces the speed requirements on frequency division elements downstream in the feedback loop, provides isolation between the mixer and the VCO and determines the actual reference frequency. It may be noted that the reference frequency equals the channel spacing divided by *K*. For example, if the VCO output frequency is to provide 50 KHZ spacing and if the fixed divider *K* is 2 , the reference frequency will be 25 KHZ.

The function of mixer 18 is to provide heterodyne action. Mixer 18 converts the fixed divider output frequency to a lower frequency based on the injection it receives from heterodyne oscillator 19 (utilizing crystal **19*a* and oscillating at 53.93125 MHZ). The effect is to shift the divided VCO frequency to some lower value. If the VCO is considered as having a band of programmable output frequencies, then mixer 18** will have the same band of output frequencies divided by *K* and shifted by the heterodyne oscillator frequency. The NAV MHZ and KHZ wafer switches are used to select channeling information and to apply that information to programmable divider 14. Divider 14 may comprise several synchronous or ripple cascaded counters having a preselected number of states, *n*, so that after *n* pulses are counted, an output pulse will be generated and the count cycle repeated.

Wafer switches 20 control the division integer selected in programmable divider 14. The dynamics of the feedback loop are such that the programmable divider output $f_x$ is always equal to $f_{ref}$. Therefore, if the programmable divider ratio selected is $n$, the programmable divider input frequency is $nf_{ref}$.

The basic frequencies appearing in the NAV SMO during phase lock are listed on FIG. 1 in terms of the reference frequency $f_{ref}$, the heterodyne oscillator frequency $f_{hf}$, the programmable divider ratio $n$ and the fixed divider $K$. Finally, the force condition or phase lock may be expressed as the VCO output frequency $f_{VCO} = K(f_{hF} - nf_{ref})$ thereby mathematically expressing how the synthesized frequency is varied in increments by changing the divide ratio $n$. As a result, a desired VCO output frequency is selected by channeling the control head to obtain the appropriate programmable divider integer $n$.

The COM SMO 11 includes many of the basic elements and operational features that were previously discussed with respect to NAV SMO 10. In this regard, the phase and frequency comparator 13*c*, programmable divider 14*c*, low pass filter 15*c*, VCO 16*c*, fixed frequency divider 17*c*, mixer 18*c*, heterodyne oscillator 19*c* and the COM wafer switches 20c all operate in a similar manner as described above. There are, however, certain changes in heterodyne oscillator 19*c* and the associated switches 20*c* which facilitate the unique combination and operation of the now to be described COM SMO.

One significant feature of the COM SMO is in the utilization of two crystals in heterodyne oscillator 19*c*. Each one of the crystals 19d (66.525 MHZ) and 19*e* (71.025 MHZ) has an associated band of frequencies which corresponds with the two equal segments of the VCO output band. In the case of airborne communication transceivers, the band that normally covers 118.00 MHZ to 135.95 MHZ is divided into two equal elements.

FIG. 2 shows a block diagram of the utilization of the two band circuit scheme in a transceiver wherein the super heterodyne receiver uses high side mixer injection ($f_{if} = f_{VCO} - f_{rf}$) when the low band is channeled, and low side mixer injection when the high band is channeled. To select low band or high band operation, the appropriate heterodyne oscillator crystal is selected. FIG. 2*a* is a table showing the allocation of crystals per band in both transmit and receive. These conditions are the four combinations of transmit and receive in conjunction with high band, low band operation. The table summarizes the selected crystal according to the mode of operation. If a high band channel is dialed, the receiver operates with low side injection from the frequency synthesizer. In this condition, the low crystal is selected. If the operator wishes to transmit, he keys the microphone (closing the switch labeled MIKE KEY) which selects the high reference crystal and steps the frequency synthesizer output frequency by the IF frequency. Releasing the microphone key restores selection of the low crystal and the proper injection is applied to the receiver mixer. If the operator dials a channel in the low band, for instance 118.00 MHZ, the high crystal is selected. When the microphone is keyed, the low crystal is selected and the VCO frequency is reduced by an increment corresponding to the IF frequency ($f_{if}$).

The above described system offers several advantages over known prior art systems. For example, 2*n* channels may be synthesized with an *n* channel programmable divider. A counter with 180 useful digits may be used to synthesize 360 channels. By reducing the total number of digits required in any given programmable divider the divide ratio is reduced (the ratio of the maximum frequency division to the minimum division). This is important because the lower the divide ratio the less gain variation in the feedback loop and the easier the loop is to stabilize. Accordingly, the unit is less complex having fewer components yet it is capable of better performance.

Another significant advantage of the above system is that the synthesized frequency remains in the COM band and minimizes radio frequency interference (RFI) with navigation equipment or other radios. Also, the reduction of the programmable divider input frequency by a factor of two minimizes spurious radiation, reduces cost and permits the use of lower frequency flip-flops. The two crystal approach allows very rapid transmit to receive transitions. The VCO bias voltage remains essentially constant, the only variations in the circuit are the shift from one crystal to another along with the selection of a different VCO tuning capacitor.

Most of the above features may be related to the utilization of high side, low side injection and combination in the communications receiver. The total system is composed of two substantially similar SMOs and/or frequency synthesizers. The COM SMO which is a 180 digit, 360 channel, frequency synthesizer is very similar to the NAV SMO which is a 200 digit, 200 channel, synthesizer. This similarity is so great that the units share identical digital circuitry, with analog circuitry of similar configuration with differences being primarily in component values. Economic advantages are plainly gained by consolidation of part types and the ability to increase quantities in the same design, along with the attendant features of ease of engineering, production testing, field maintenance, and the packaging considerations included within the unit housing.

The above discussion of the unit in FIG. 1 pertained primarily to "1 + 1" systems. These are systems where the navigation receiver and communications transceiver may be used simultaneously. It is significant that many of the unique features mentioned above may also be utilized in a "1" system operation. The "1" system operates to provide both the navigation and communication synthesizer function but not simultaneously.

As shown in FIG. 3, the SMO in the "1" system operates in a similar manner to that described above with respect to FIG. 1. The phase frequency comparator 22 and reference frequency oscillator 21, low pass filter 24, voltage control oscillator 25, fixed divide by *n* 26, mixer 27, heterodyne oscillator 28 and programmable divider 23 operate as described previously. Again, a two crystal (note the use of crystals 28*a* and 28*b*), two band system is employed.

Figure 3A:
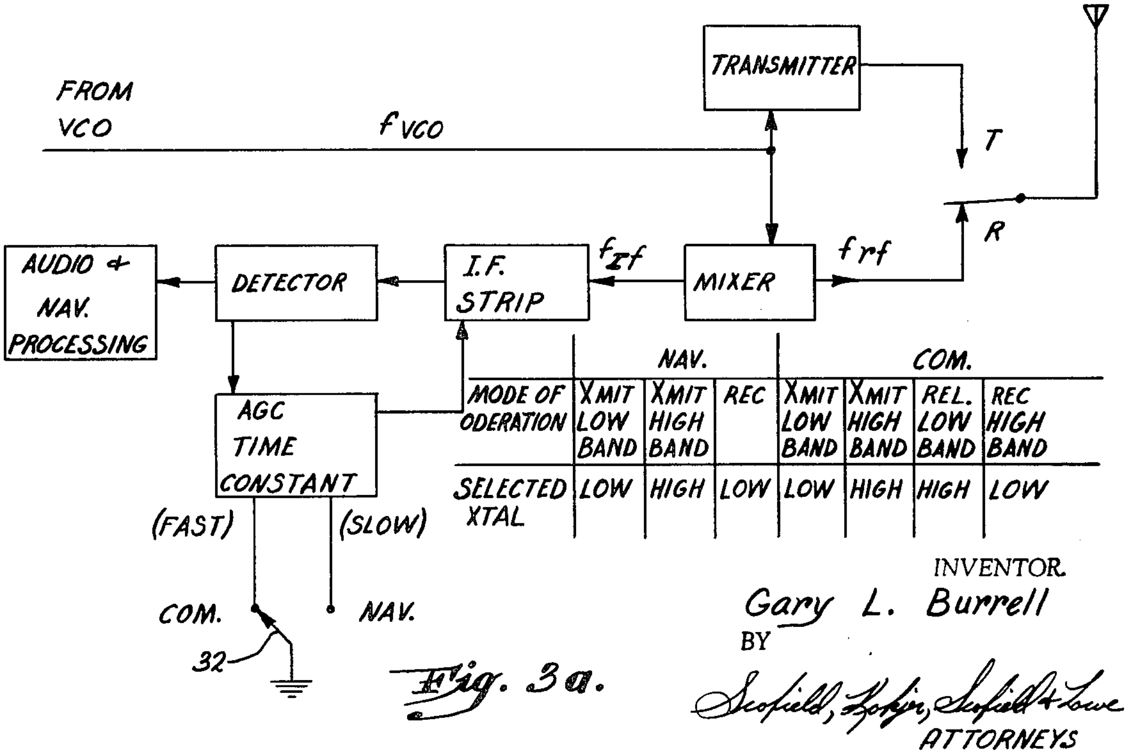

For navigation frequency synthesis, low crystal 28*a* is chosen and the NAV wafer switch lines 29*a* are activated. In this mode of operation, the receiver has high side injection so that the frequency synthesizer will develop a frequency in the COM band having the condition of operation wherein $f_{VCO} - f_{rf} = f_{if}$ (see FIG. 3*a*). With switch 32 in the NAV position, the AGC time constant is lengthened to allow for proper signal processing of the VOR NAV and LOC modulation signals.

When the unit is used for voice communications, the receiver time constant is reduced to allow rapid AGC response to voice communications. A normal panel configuration for such a unit would likely contain a NAV control head and a COM control head with a rocker switch (32) selecting either the COM channeling information or the NAV channeling information. The operator could select a desired NAV channel and a desired COM channel on his control heads, and then switch very quickly from one to the other as he navigated cross-country and communicated with air traffic controllers. The high-low switch 30 operates to switch from either the high or the low band (either crystal 28*a* or 28*b*). If the operator has a NAV channel dialed, with the NAV/COM switch in the NAV position and keys the microphone, the system automatically reverts to the communications mode of operation and transmits on the channel selected on the COM control head. This allows duplex operation commonly used in navigation where the pilot will talk on a normal COM frequency and listen on his navigation receiver frequency.

When the COM/NAV switch 32 is in the COM position, the high-low switch 30 and TR relay switch contacts 31 function identically to the manner described previously with respect to the COM SMO in FIG. 1. With the NAV/COM switch in the NAV position, and with the microphone unkeyed the receiver contact activates the low frequency crystal 28*a* and normal NAV receive condition is implemented. When the microphone is keyed, the TR (transmit) contact is made which initiates the normal COM high-low action. The wafer switch selection could then be accomplished by a multiple pole NAV/COM relay or by digital circuitry.

Known "1" systems utilize banks of crystals to supply frequency synthesis. My device shown in FIG. 3 can compete economically with crystal synthesizers while at the same time affords better performance in spurious and very rapid transitions from NAV to COM, and from COM transmit to COM receive. In addition, more channels are available than in the prior art "1" systems. Furthermore, the number of crystals used is reduced in lieu of integrated circuits thereby improving reliability. This is of vital importance in a "1" system because a failure cuts off all communication and navigation functions. Whereas in a "1 + 1" system, failure of either NAV or COM leaves the other for communication purposes.

The block diagram shown in FIG. 4 relates to a "1 + 1" system using multiplex techniques. It illustrates the use of a single feedback loop to control two or more VCOs. Again, the feedback loop is similar to that described with respect to FIG. 1. However, a sample and hold circuit, is used to periodically update the VCO bias. During the update period the sequence of operation is such that the $VCO_1$ output is switched to the fixed divider circuit. Then the wafer switches associated with $VCO_1$ are activated. The heterodyne crystal associated with $VCO_1$ is selected and the sample and hold circuit 1 updates the $VCO_1$ bias voltage according to the low pass filter output voltage. Sample and hold circuit 1 holds the $VCO_1$ bias voltage after disconnecting from the low pass filter. The output of $VCO_1$ is disconnected from the fixed divider circuit and the sequence continues updating in turn on $VCO_2$ up and through $VCO_n$ and back to $VCO_1$.

Each VCO supplies a continuous frequency output signal for a receiver or transmitter. As a result, the system provides continuous synthesis of several frequencies using only a single feedback loop. Reliability and lower cost factors are enhanced in that fewer components are required to accomplish the total function. Of course, conventional control heads labeled 1, 2 through *n* would be utilized with a sequencer circuit 35 to control the programmable fixed divider, the crystal controlled heterodyne oscillator and to appropriately strobe the sample and hold circuits labeled 1 through *n*. The VCO output switch designated by the numeral 36 would act to disconnect the appropriate VCO output from the feedback loop upon utilization of the predetermined sequence of operation.

From the foregoing, it will be seen that this invention is one well adapted to attain all of other ends and objects hereinabove set forth together with oJher advantages which are obvious and which are inherent to the structure.

It will be understood that certain features and subcombinations are of utility and may be employed without reference to other features and subcombinations.

As many possible embodiments may be made of the invention without departing from the scope thereof, it is to be understood that all matter herein set forth or shown in the accompanying drawings is to be interpreted as illustrative and not in a limiting sense.

Having thus described my invention, I claim:

1. In a system comprising a plurality of receivers or transceivers, the combination therewith of:

a reference frequency signal, a plurality of stabilized master oscillators (SMO's) having a frequency band associated with each SMO, means for applying said reference frequency signal to each of said SMO's, and means for selecting a plurality of discrete frequency channels in a plurality of said associated frequency bands of said SMO's, said combination thereby operating to provide frequency synthesis in said frequency bands.

2. The combination as in claim 1 wherein a frequency band associated with at least one said SMO is dividable into a high segment and a low segment, a mixer and a heterodyne oscillator in said SMO, a high crystal and a low crystal associated with said heterodyne oscillator, means for switching said crystals to enable high side mixer injection to be used with a channel selected in said low band segment and low side mixer injection to be used with a channel selected in the high band segment.

3. In a navigation receiver communications transceiver, the combination therewith of:

a reference frequency signal, a navigation stabilized master oscillator (NAV SMO), a communications stabilized master oscillator (COM SMO), means for applying said reference frequency signal to said NAV SMO and to said COM SMO, each one of said SMO's operatively including a mixer and a (heterodyne oscillator) local oscillator therein, and means for selecting a discrete frequency from a preselected frequency band, said combination thereby operating to provide frequency synthesis over said preselected frequency band.

4. The combination as in claim 3 wherein said COM SMO has an associated communications band that is divided into two segments, said segments thereby providing a high and low band for transmitting and a high and low band for receiving, and means for accomplishing rapid transition between transmit and receive.

5. The combination as in claim 4 wherein said COM local oscillator includes a high crystal and a low crystal, said transition accomplishing means including a switch means for operatively interconnecting said high crystal in said local oscillator for high band transmitting and low band receiving and operatively interconnecting said low crystal in said local oscillator for high band receiving and low band transmitting.

6. The invention as in claim 5 wherein said band segments include an equal number of usable channels.

7. A navigation receiver communications transceiver comprising a stabilized master oscillator, said stabilized master oscillator including a programmable divider, said stabilized master oscillator being capable of synthesizing the frequency of a preselected frequency band by changing the divide ratio of said programmable divider, a plurality of control heads, and means for switching from one control head to another to change the mode of operation from navigation receive to communications transceive and to change the divide ratio of the programmable divider.

8. A device for receiving or transceiving, said device comprising a stabilized master oscillator capable of providing frequency synthesis in a preselected frequency band, said stabilized master oscillator including a programmable frequency divider, and a plurality of voltage control oscillators, said stabilized master oscillator further having a feedback loop interconnecting the outputs of said voltage control oscillators, means for periodically updating the output frequencies of the voltage control oscillators using multiplex techniques, said device thereby simultaneously synthesizing a number of frequencies in accordance with a plurality of control head settings for a plurality of receivers and/or transceivers.

* * * * *